(12) United States Patent
Kawasaki et al.

(10) Patent No.: US 11,047,887 B2
(45) Date of Patent: Jun. 29, 2021

(54) CURRENT SENSOR, DETECTION DEVICE, DETECTION METHOD, AND PROGRAM

(71) Applicant: Asahi Kasei Microdevices Corporation, Tokyo (JP)

(72) Inventors: Toshiaki Kawasaki, Tokyo (JP); Ryuji Nobira, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 77 days.

(21) Appl. No.: 16/556,227

(22) Filed: Aug. 30, 2019

(65) Prior Publication Data
US 2020/0072876 A1 Mar. 5, 2020

(30) Foreign Application Priority Data

Aug. 31, 2018 (JP) .............................. JP2018-163871
Jun. 12, 2019 (JP) .............................. JP2019-109319

(51) Int. Cl.
G01R 33/00 (2006.01)
G01R 19/00 (2006.01)
G01R 15/14 (2006.01)
G01R 33/02 (2006.01)

(52) U.S. Cl.
CPC ....... G01R 19/0092 (2013.01); G01R 15/148 (2013.01); G01R 33/02 (2013.01)

(58) Field of Classification Search
CPC .. G01R 33/0029; G01R 33/02; G01R 33/072; G01R 33/07; G01R 33/091; G01R 33/0035; G01R 33/0017; G01R 15/20; G01R 15/148; G01R 19/0092
See application file for complete search history.

(56) References Cited

U.S. PATENT DOCUMENTS

| | | | | |
|---|---|---|---|---|
| 8,031,882 B2* | 10/2011 | Ding | .................... | H04R 3/002 |
| | | | | 381/96 |
| 8,542,010 B2* | 9/2013 | Cesaretti | ............ | G01R 33/0035 |
| | | | | 324/251 |
| 10,809,312 B2* | 10/2020 | Ikushima | ............... | G01R 31/52 |
| 2014/0239946 A1 | 8/2014 | Suzuki | | |
| 2016/0202294 A1* | 7/2016 | Snoeij | ................... | G01R 15/20 |
| | | | | 324/127 |
| 2017/0030979 A1* | 2/2017 | Cesaretti | ................ | G01R 33/07 |
| 2018/0372508 A1* | 12/2018 | Polley | ................... | G01D 5/145 |

FOREIGN PATENT DOCUMENTS

JP 2005283451 A 10/2005

* cited by examiner

*Primary Examiner* — Thang X Le

(57) ABSTRACT

Deterioration in transient response characteristics of a current sensor may cause overshoot or delay. Thus, it is difficult to achieve good transient response characteristics of a magnetic field. A current sensor is provided, including: a detection unit outputting a signal corresponding to a magnetic field generated by detection current flowing through a current path; a reception unit receiving the signal corresponding to the magnetic field; a filter unit filtering the signal received by the reception unit; and an output unit outputting an output signal indicating the detection current according to the filtered signal, wherein detection gain, as gain of magnetic flux density detected by the detection unit, has a gain fluctuation band that changes with an increase in a frequency of the detection current, and the filter unit has gain that cancels out the change in the detection gain in at least a part of the gain fluctuation band.

20 Claims, 19 Drawing Sheets

CURRENT SENSOR, DETECTION DEVICE, DETECTION METHOD, AND PROGRAM

The contents of the following Japanese patent application(s) are incorporated herein by reference:
NO. 2018-163871 filed in JP on Aug. 31, 2018, and
NO. 2019-109319 filed in JP on Jun. 12, 2019.

BACKGROUND

Technical Field

The present invention relates to a current sensor, a detection device, a detection method, and a program.

Related Art

There is conventionally known a current detection device that has a current detection unit formed from a current path through which current flows and a magnetic sensor, and detects a magnetic field generated by the current with the magnetic sensor (for example, refer to JP 2005-283451 A). In addition, in a detection device, a low pass filter may be used for the input of high frequency current from a magnetic sensor (for example, refer to JP 2013-124875 A).

SUMMARY

Such a current detection device may require good magnetic field transient response characteristics in order to detect current transient changes such as a sharp rise and fall of the current flowing through the current path. However, even if a magnetic sensor having good transient response characteristics is assembled as a current detection device, the magnetic sensor may become deteriorated in the characteristics of current measurement when operated as a current detection device. Such deterioration in the transient response characteristics may cause overshoot or delay. Thus, it is difficult to achieve good transient response characteristics of the magnetic field in the current detection device.

In order to solve the foregoing issue, there are provided a current sensor and a program in a first aspect of the present invention. The current sensor includes: a detection unit that outputs a signal corresponding to a magnetic field generated by detection current flowing through a current path; a reception unit that receives the signal corresponding to the magnetic field; a filter unit that filters the signal received by the reception unit; and an output unit that outputs an output signal indicating the detection current according to the filtered signal. Detection gain, as gain of magnetic flux density detected by the detection unit, has a gain fluctuation band that changes along with an increase in a frequency of the detection current. The filter unit has gain that cancels out the change in the detection gain in at least a part of the gain fluctuation band.

In a second aspect of the present invention, there is provided a detection method for detecting a detection current flowing in a current path. The detection method includes: a step of receiving a signal corresponding to a magnetic field generated by the detection current; a step of filtering the received signal; and a step of outputting an output signal indicating the detection current according to the filtered signal. Detection gain, as gain of magnetic flux density of the magnetic field has a gain fluctuation band that changes along with an increase in a frequency of the detection current. The step of filtering has a step of filtering the signal by a filter that has gain that cancels out the change in the detection gain in at least a part of the gain fluctuation band.

In a third aspect of the present invention, there is provided a detection device that detects a detection current flowing in a current path. The detection device includes: a reception unit that receives a signal corresponding to a magnetic field generated by detection current; a filter unit that filters the signal received by the reception unit; and an output unit that outputs an output signal indicating the detection current according to the filtered signal. The filter unit has a gain that attenuates along with an increase in a frequency in at least a part of a frequency range in which a gain of the signal with respect to the detection current increases, and does not attenuate along a further increase in the frequency.

The foregoing summary of the invention does not enumerate all the necessary features of the present invention. In addition, sub combinations of these feature groups can also be an invention.

DETAILED DESCRIPTION

Hereinafter, the present invention will be described through embodiments of the invention, but the following embodiments do not limit the invention according to the claims. Moreover, all combinations of features described in relation to the embodiments are not necessarily essential to the solution of the invention.

Figure 1:
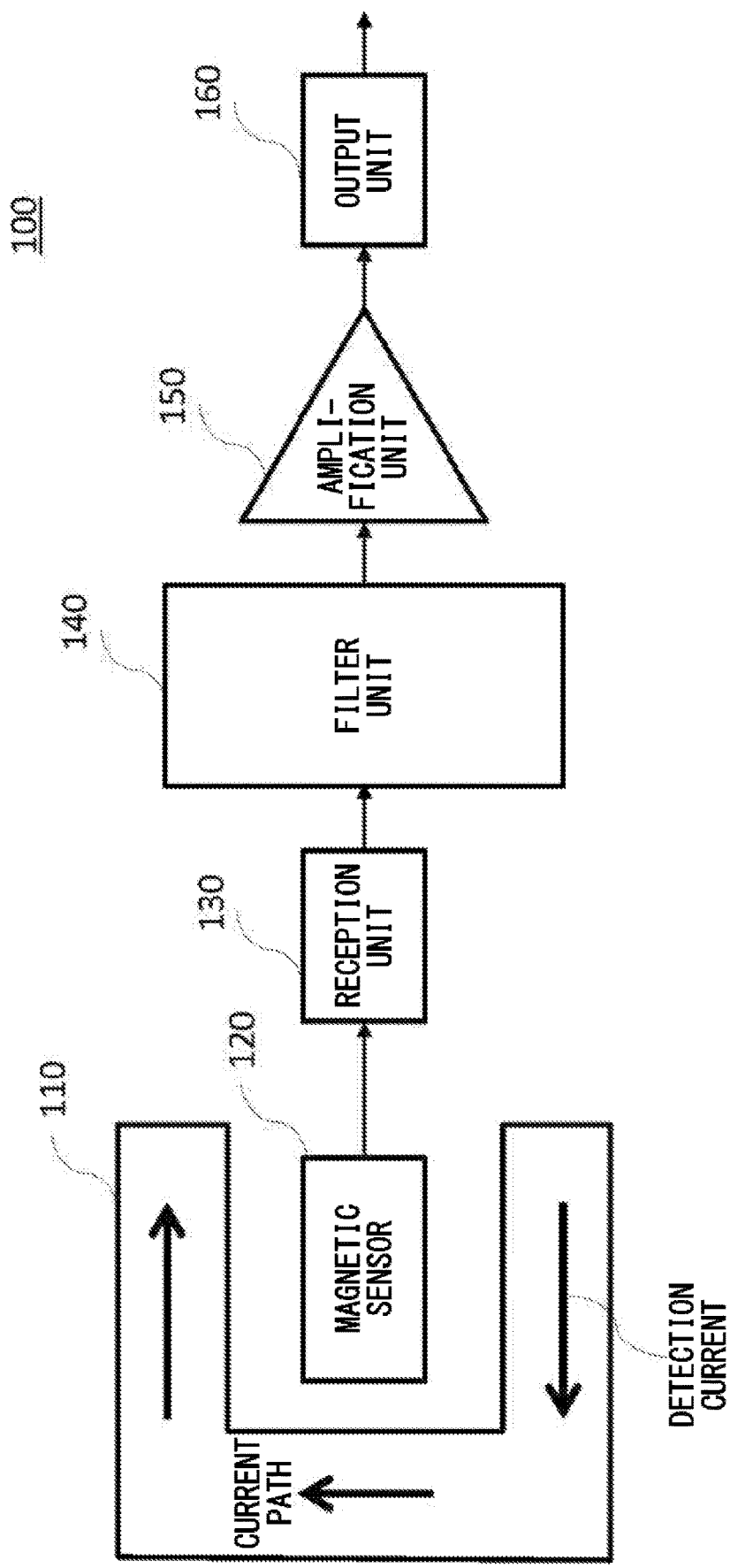
FIG. 1 illustrates a first configuration example of a detection device according to the present embodiment.

FIG. 1 illustrates a first configuration example of a detection device according to the present embodiment. The detection device 100 is used as a current sensor that detects a detection current flowing in a current path 110. The detection device 100 processes a signal output from a magnetic sensor 120 when the detection current flows in the current path 110, and outputs an output signal indicating a current amount, a rise, a fall, or the like of the detection current. The detection device 100 includes the current path 110, the magnetic sensor 120, a reception unit 130, a filter unit 140, an amplification unit 150, and an output unit 160. The detection device 100 may be one in which at least one component of the detection device 100 is disposed on a substrate and covered with a package made of an insulating material such as resin or ceramic.

The current path 110 may be, for example, a conductor such as metal formed on a substrate in a package. In the example of FIG. 1, the current path 110 may be one in which the detection current flows clockwise so as to surround the magnetic sensor 120 in the top view of FIG. 1. The cross-sectional shape of the current path 110 with respect to the direction of current flow may be square, regular square, trapezoid, polygon, circle, oval, or the like, or a combination thereof. When the detection current flows, the current path 110 generates a clockwise magnetic field around the current path 110 with respect to the direction in which the detection current flows. The magnetic field is thereby applied substantially downward to the magnetic sensor 120.

The magnetic sensor 120 is disposed in the vicinity of the current path 110 and is connected to the reception unit 130 by wire or wirelessly. The magnetic sensor 120 is, for example, includes at least one of Hall element, magnetoresistive element (MR), giant magnetoresistive element (GMR), tunnel effect magnetoresistive element (TMR), magnetic impedance element (MI element), an inductance sensor, and others. The magnetic sensor 120 may be contained in the same package as the current path 110. The magnetic sensor 120 may detect a magnetic field generated by the detection current flowing in the current path 110, and may output a signal having a current value or a voltage value corresponding to the magnetic field to the reception unit 130.

The reception unit 130 is connected to the filter unit 140. The reception unit 130 receives a signal corresponding to the magnetic field generated by the detection current from the magnetic sensor 120, and outputs the signal to the filter unit 140. The reception unit 130 may be a wire or a terminal for receiving a signal from the magnetic sensor 120.

The filter unit 140 may be connected to the amplification unit 150 and may include an active filter or a passive filter. The filter unit 140 may filter and reduce the amplitude of the signal received by the reception unit 130 in a predetermined frequency range, and may output the filtered signal to the amplification unit 150. The filter unit 140 has a gain that attenuates with a frequency increase in at least a part of a frequency range in which the gain of the signal with respect to the detection current increases, and does not attenuate with a further increase in frequency.

The amplification unit 150 is connected to the output unit 160 and may be, for example, an operational amplifier or a comparator. The amplification unit 150 amplifies the signal filtered by the filter unit 140. The amplification unit 150 may amplify the amplitude of the signal with a predetermined gain before outputting.

The output unit 160 outputs an output signal indicating the detection current according to the filtered signal received from the amplification unit 150.

Figure 2:
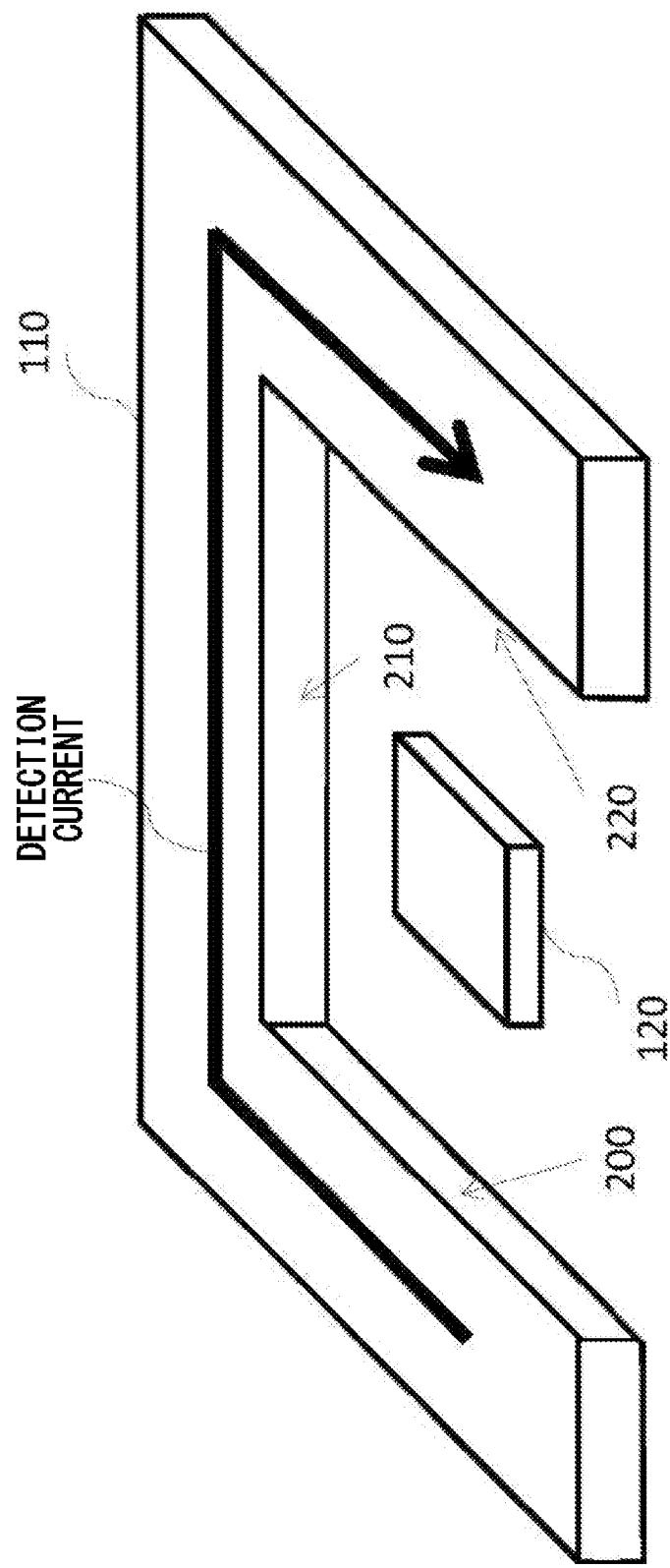
FIG. 2 is a diagram illustrating an example of arrangement of a current path and a magnetic sensor.

FIG. 2 is a diagram illustrating an example of arrangement of the current path 110 and the magnetic sensor 120. FIG. 2 illustrates the arrangement in which the current path 110 surrounds the magnetic sensor 120. In this arrangement, the detection current flows so as to surround the magnetic sensor 120. FIG. 2 illustrates the magnetic sensor 120 and the current path 110 to be arranged at the same height (on the same plane). However, the arrangement of the magnetic sensor 120 with respect to the current path 110 may be changed in accordance with the orientation of a magnetic sensing axis of the magnetic sensor 120. That is, in the case of using an element (such as a Hall element) that detects a magnetic field component in a direction perpendicular to the plane on which the current path 110 is disposed, as the magnetic sensor 120, the element may be disposed as illustrated in FIG. 2. On the other hand, in the case of using an element (such as a magnetoresistive element) that detects a magnetic field component in a direction parallel to the plane on which the current path 110 is disposed, as the magnetic sensor 120, the magnetic sensor 120 may be disposed above or below the current path 110 in the direction perpendicular to the plane on which the current path 110 is disposed. The same applies to the drawings other than FIG. 2. When the frequency of the detection current flowing through the current path 110 is increased, the detection current is concentrated due to the skin effect on surfaces 200, 210, and 220 of the current path 110 on the magnetic sensor 120 side. When the current density increases in the vicinities of the surfaces 200, 210, and 220 of the current path 110 near the magnetic sensor 120, the magnetic flux density detected by the magnetic sensor 120 is amplified more than the magnetic flux density when the direct current flows through the current path 110. With the magnetic flux density amplified due to the skin effect, an amplified signal indicating a larger amount of current than the actual detection current is output from the magnetic sensor 120. As the frequency of the detection current becomes higher, the skin effect becomes more remarkable and the magnetic flux density detected by the magnetic sensor 120 becomes larger. When the frequency of the detection current further increases, the change in the distribution of the current density in the current path 110 becomes sufficiently small, the gain of the magnetic flux density detected by the magnetic sensor 120 becomes saturated, and the gain of the signal also becomes saturated and constant.

In the present application, the gain of the signal with respect to the detection current may be the amplification factor of the signal output from the magnetic sensor 120 amplified due to the skin effect with respect to the signal corresponding to the amount of current when the direct detection current flows.

Figure 3:
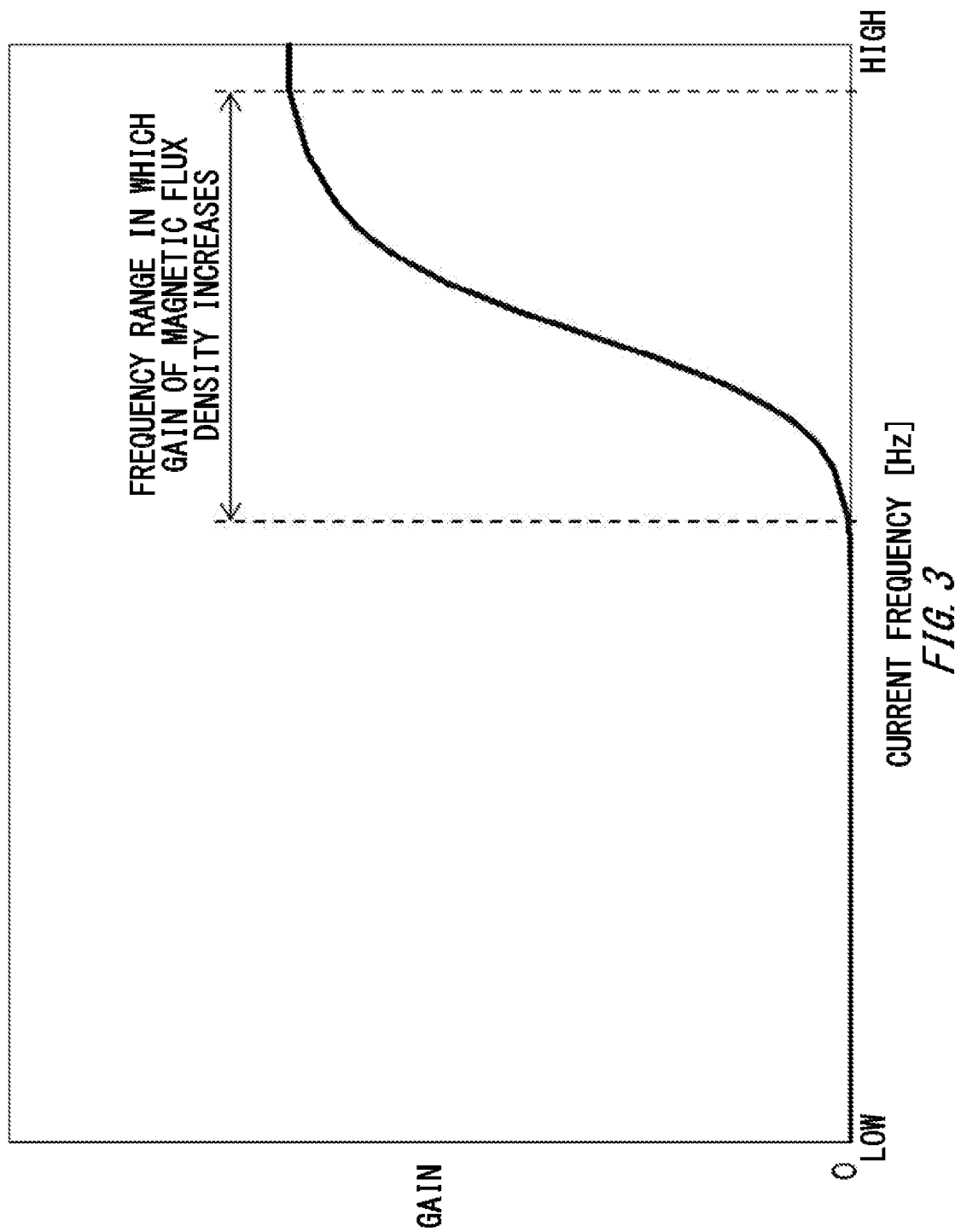
FIG. 3 is a graph illustrating the relationship between the frequency of detection current and the gain of magnetic flux density detected by the magnetic sensor.

FIG. 3 is a graph illustrating the relationship between the frequency of the detection current and the gain of the magnetic flux density detected by the magnetic sensor 120. In FIG. 3, the vertical axis represents the gain of the magnetic flux density, and the horizontal axis represents the frequency of the detection current. FIG. 3 illustrates the gain corresponding to the frequency, assuming that the steady-state gain of the detection current is zero. As illustrated in FIG. 3, the gain of the magnetic flux density detected by the magnetic sensor 120 rises at a predetermined range of frequencies of the detection current (also referred to as gain fluctuation band), and becomes saturated and constant at still higher frequencies. Note that the gain of the signal relative to the detection current may change similarly to the gain of the magnetic flux density illustrated in FIG. 3.

Figure 4:
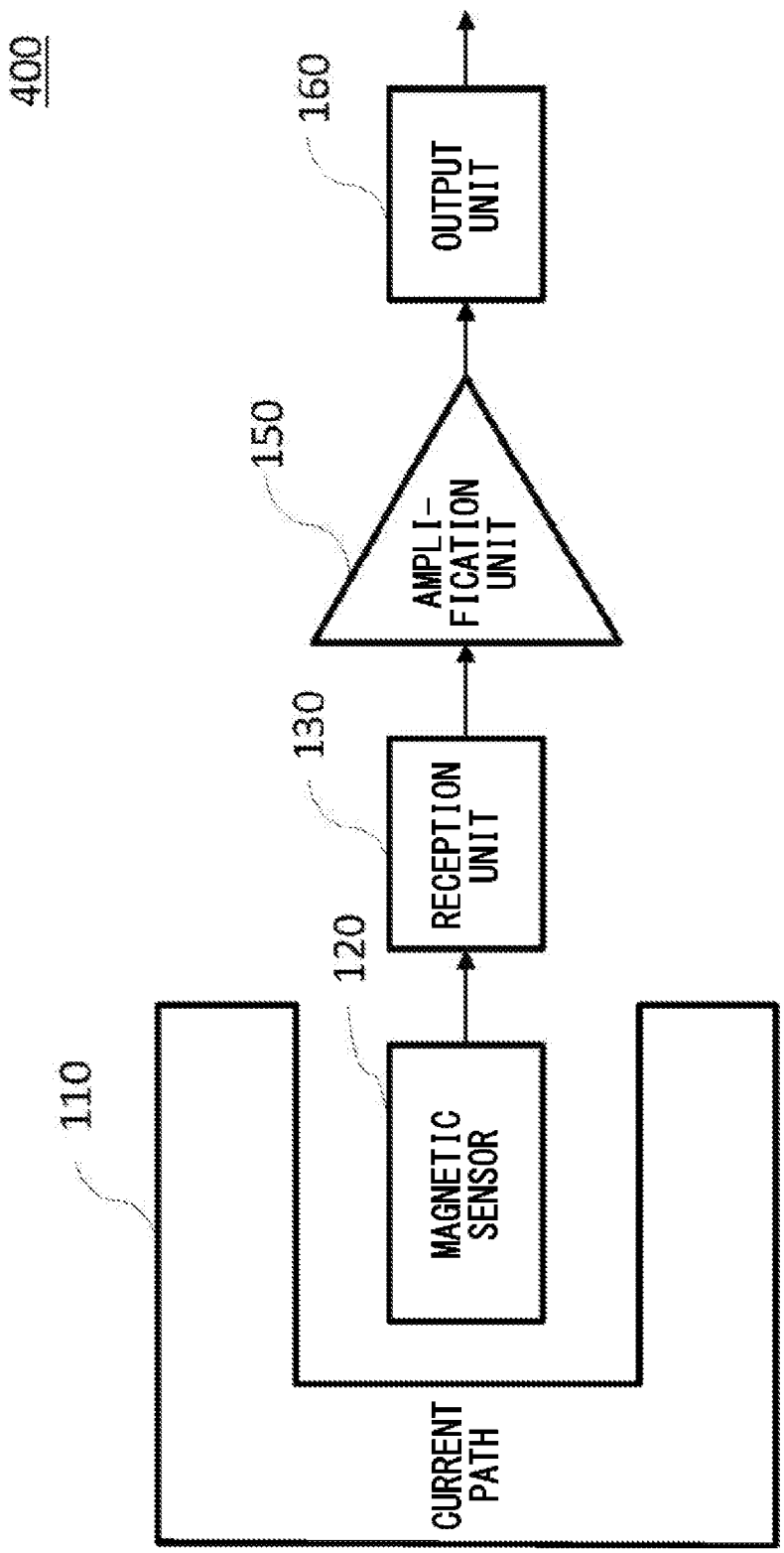
FIG. 4 illustrates a detection device of a first comparative example.

FIG. 4 illustrates a detection device 400 of a first comparative example. The detection device 400 illustrated in FIG. 4 is configured in the same manner as the detection device 100 of the first configuration example illustrated in FIG. 1 except that the filter unit 140 is not provided. The description of the same components as those of the detection device 100 of the first configuration example illustrated in FIG. 4 will be omitted. The detection device 400 of the first comparative example amplifies the signal received by the reception unit 130, by the amplification unit 150, and outputs the signal without filtering.

Figure 5:
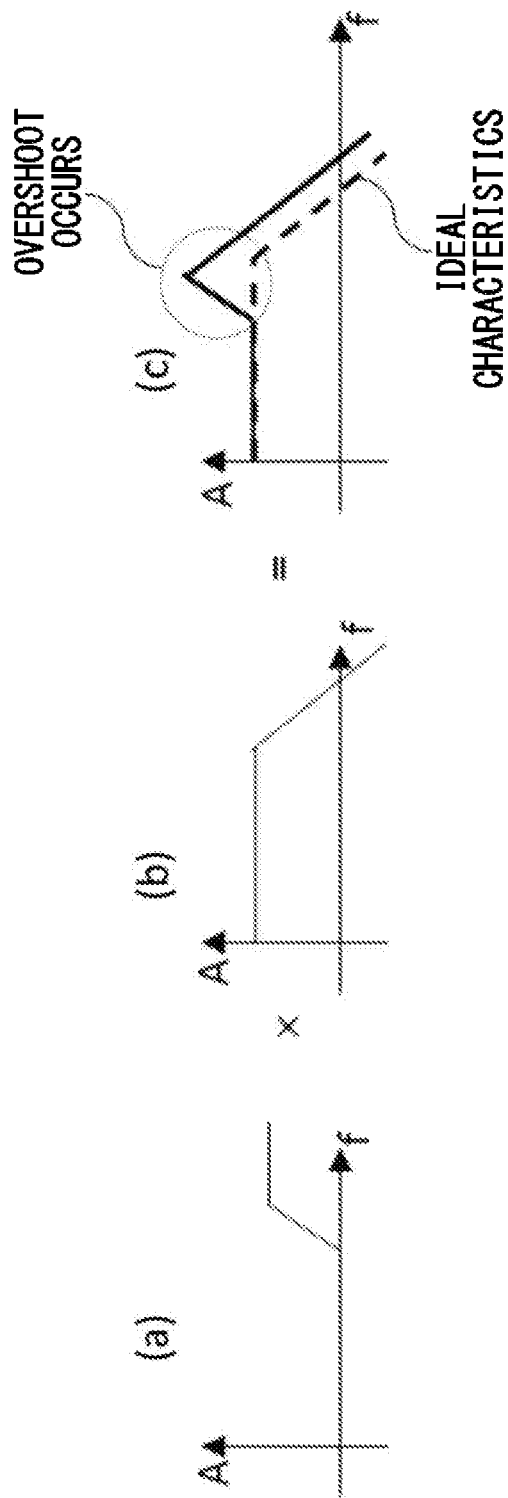
FIG. 5 illustrates diagrams describing the gain of a signal in the detection device of the first comparative example.

FIG. 5 illustrates diagrams describing the gain of a signal in the detection device 400 of the first comparative example. (a) of FIG. 5 illustrates frequency characteristics of gain of a signal due to the skin effect. (b) of FIG. 5 illustrates the frequency characteristics of gain of amplification of a signal by the amplification unit 150. (c) of FIG. 5 illustrates the total of the gain due to the skin effect and the gain by the amplification unit 150 by a solid line, and also illustrates ideal characteristics of the total gain by a dotted line. In FIG. 5, a vertical axis A indicates the gain of the signal, and a horizontal axis f indicates the frequency of the signal.

The total gain illustrated in (c) of FIG. 5 is excessively large in the frequency range in which the gain of the signal due to the skin effect illustrated in (a) of FIG. 5 increases. In the detection device 400 of the first comparative example, for example, when the steeply rising detection current flows in the current path 110, the signal is excessively amplified, and an overshoot occurs in the frequency range in which the total gain is excessive while the detection current is transiently changing.

Figure 6:
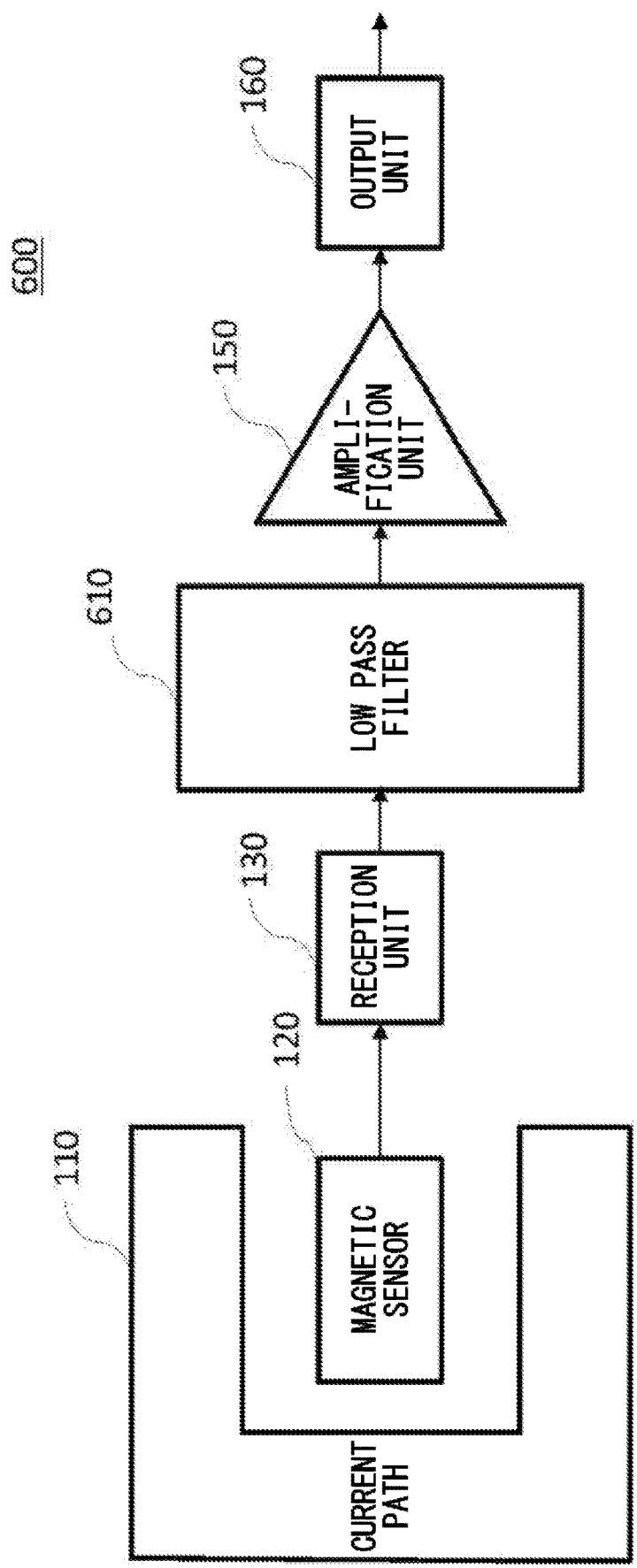
FIG. 6 is a diagram illustrating a detection device of a second comparative example.

FIG. 6 illustrates a detection device 600 of a second comparative example. The detection device 600 of the second comparative example illustrated in FIG. 6 is configured in the same manner as the detection device 100 of the first configuration example illustrated in FIG. 1, except that a low pass filter 610 is provided instead of the filter unit 140. In the detection device 600 of the second comparative example, the low pass filter 610 suppresses the gain of a signal due to the skin effect. The description of the same components as those of the detection device 100 of the first configuration example illustrated in FIG. 6 will be omitted.

The low pass filter 610 is connected between the reception unit 130 and the amplification unit 150, reduces the signal from the reception unit 130 by a predetermined frequency or more, and outputs the signal to the amplification unit 150. The low pass filter 610 has a gain that attenuates from zero to negative along with an increase in frequency from a predetermined frequency.

Figure 7:
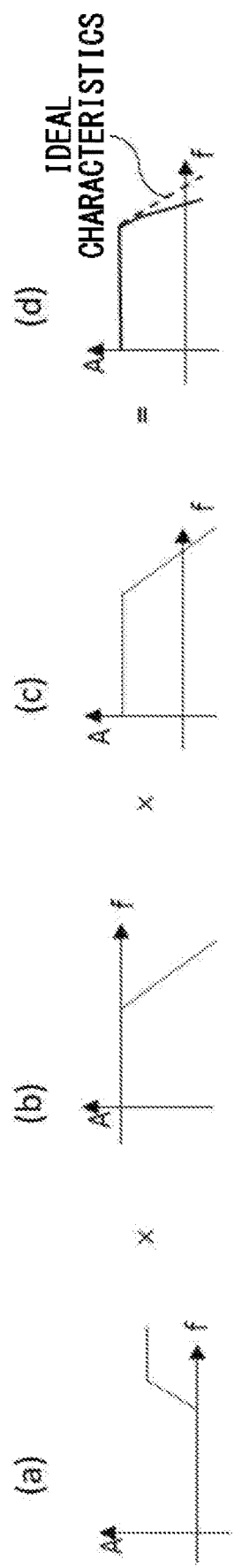
FIG. 7 illustrates diagrams describing the gain of a signal in the detection device of the second comparative example.

FIG. 7 illustrates diagrams describing the gain of a signal in the detection device 600 of the second comparative example. (a) of FIG. 7 illustrates frequency characteristics of gain of a signal due to the skin effect. (b) of FIG. 7 illustrates frequency characteristics of the gain of the low pass filter 610. (c) of FIG. 7 illustrates the frequency characteristics of gain of amplification of a signal by the amplification unit 150. (d) of FIG. 7 illustrates the total of the gain due to the skin effect, the gain of the low pass filter 610, and the gain by the amplification unit 150 by a solid line, and also illustrates ideal characteristics of the total gain by a dotted line. In FIG. 7, a vertical axis A indicates the gain of the signal, and a horizontal axis f indicates the frequency of the signal.

In the total gain of (d) of FIG. 7, the gain of the signal due to the skin effect of (a) of FIG. 7 is reduced by the gain by the low pass filter 610, but the gain attenuates too much and the total gain is reduced in the frequency range in which the gain due to the skin effect becomes saturated and constant. In the detection device 600 of the second comparative example, for example, when the steeply rising detection current flows in the current path 110, the output signal has a response waveform with few high-frequency components as compared to the response waveform of the signal from the magnetic sensor 120. This causes a response delay in the output from the output unit 160 of the detection device 600 with respect to the output of the magnetic sensor 120. When the detection device 600 of the second comparative example is equipped with the low pass filter 610 to reduce overshoot, a response delay occurs, thereby generating a trade-off relationship between overshoot and response speed. It is thus difficult to implement transient response characteristics of a favorable magnetic field.

Figure 8:
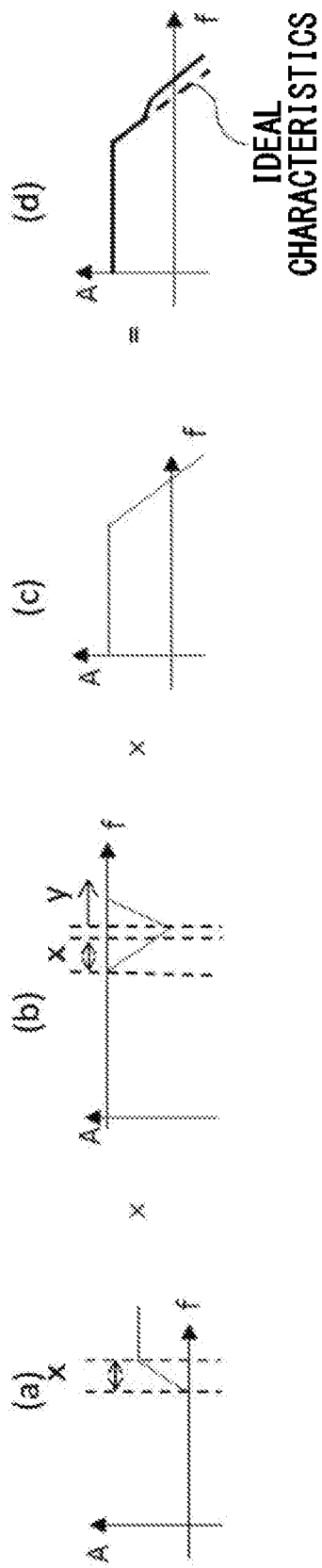
FIG. 8 illustrates diagrams describing the gain of a signal in the detection device of the first configuration example.

FIG. 8 illustrates diagrams describing the gain of a signal in the detection device 100 of the first configuration example illustrated in FIG. 1. (a) of FIG. 8 illustrates frequency characteristics of gain of a signal due to the skin effect. (b) of FIG. 8 illustrates frequency characteristics of the gain of the filter unit 140. (c) of FIG. 8 illustrates the frequency characteristics of gain of amplification of a signal by the amplification unit 150. (d) of FIG. 8 illustrates the total of the gain due to the skin effect, the gain of the filter unit 140, and the gain of the amplification unit 150 by a solid line, and also illustrates ideal characteristics of the total gain by a dotted line. As illustrated in (b) of FIG. 8, the filter unit 140 of the detection device 100 according to the first configuration example includes a band elimination filter that has a gain that attenuates from zero to minus along with frequency increase in at least part of a frequency range x in which the gain due to the skin effect increases from zero and that increases to 0 in a frequency range y larger than the frequency range x in which the gain of the signal increases due to the skin effect.

When the steeply rising detection current flows in the current path 110, for example, the detection device 100 according to the first configuration example can offset the increase in the gain of the signal due to the skin effect by the attenuated gain in the filter unit 140, thereby to suppress an overshoot. Further, in the detection device 100 according to the first configuration example, the gain in the filter unit 140 does not attenuate in the higher frequency range than the frequency range where the gain due to the skin effect is saturated. Accordingly, the total gain does not excessively attenuate so that the response characteristics to the magnetic sensor 120 can be maintained.

Figure 9:
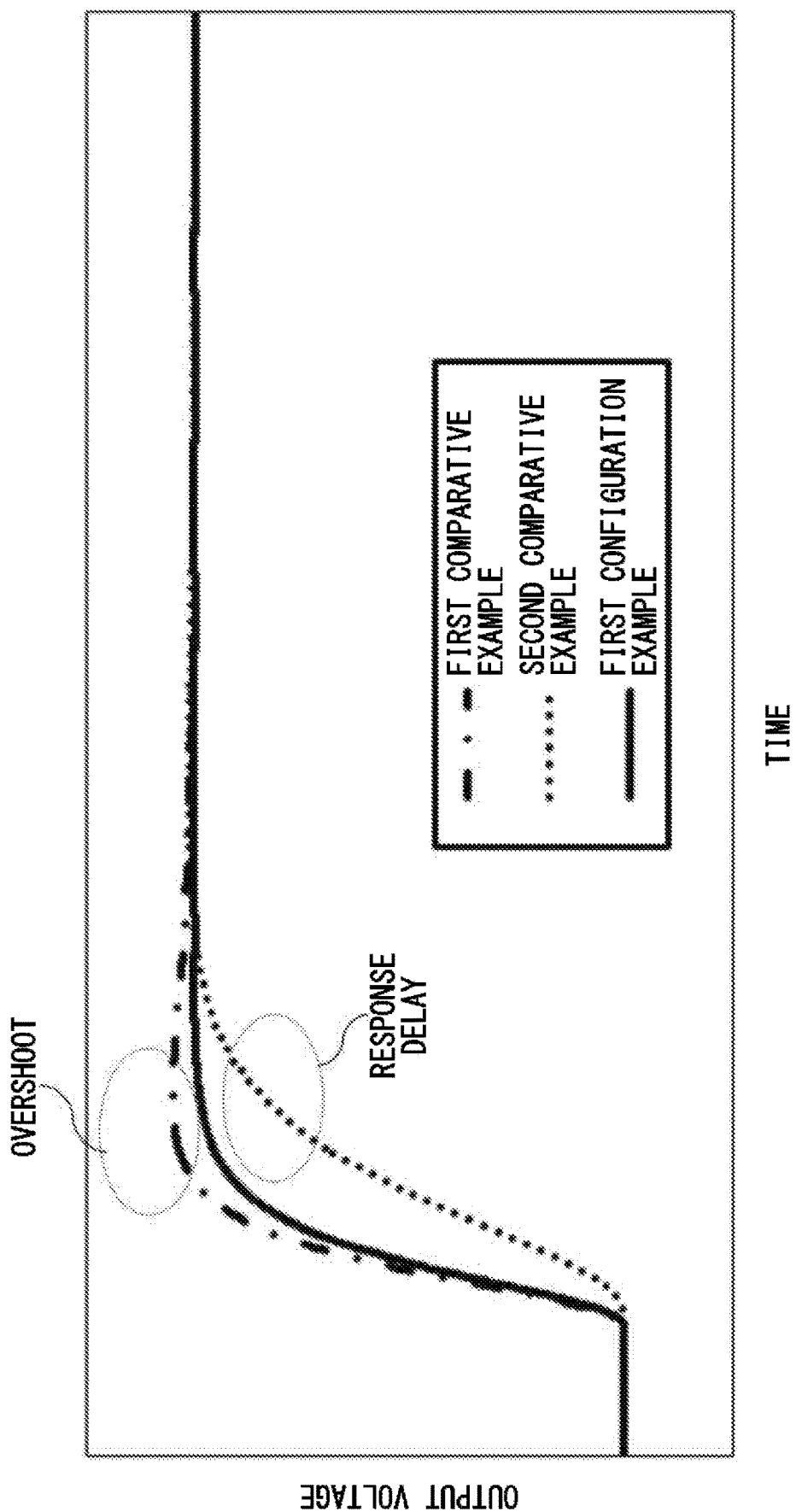
FIG. 9 is a diagram illustrating results of simulation of transient response characteristics to a current pulse input in the detection device of the first configuration example, the detection device in the first comparative example, and the detection device in the second comparative example.

FIG. 9 is a diagram illustrating results of simulation of transient response characteristics to a current pulse input into the current path 110, in the detection device 100 of the first configuration example, the detection device 400 in the first comparative example, and the detection device 600 in the second comparative example. FIG. 9 illustrates the relationship between the output voltage and time of the detection device 100 of the first configuration example, the detection device 400 of the first comparative example, and the detection device 600 of the second comparative example. In FIG. 9, the vertical axis represents the output voltage of the detection device, and the horizontal axis represents time. In the first comparative example, an overshoot occurs. In the second comparative example, an overshoot can be suppressed but a response delay occurs. In the first configuration example, the response time characteristics can be maintained while suppressing an overshoot.

Figure 10:
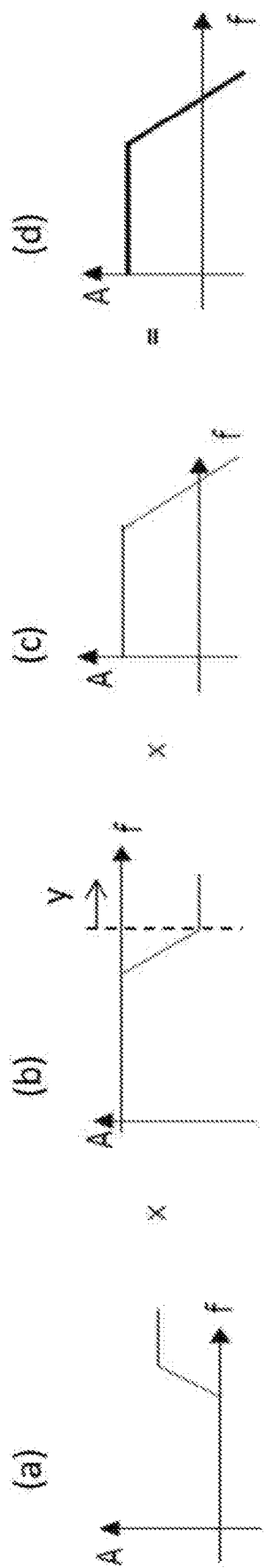
FIG. 10 illustrates diagrams describing the gain of a signal in the detection device of the first configuration example.

FIG. 10 illustrates diagrams describing the gain of a signal in the detection device 100 of the first configuration example illustrated in FIG. 1. Similarly to FIG. 8, FIG. 10 illustrates the gain in the detection device 100 of the first configuration example illustrated in FIG. 1, but the gain of the filter unit 140 is different. (a) of FIG. 10 illustrates frequency characteristics of gain of a signal due to the skin effect. (b) of FIG. 10 illustrates frequency characteristics of the gain of the filter unit 140. (c) of FIG. 10 illustrates the frequency characteristics of gain of amplification of a signal by the amplification unit 150. (d) of FIG. 10 illustrates the total of the gain due to the skin effect, the gain of the filter unit 140, and the gain of the amplification unit 150 by a solid line. In FIG. 10, a vertical axis A indicates the gain of the signal, and a horizontal axis f indicates the frequency of the signal.

As illustrated in (b) of FIG. 10, the filter unit 140 has a gain that attenuates from zero to minus along with frequency increase in a frequency range in which the gain of the signal due to the skin effect increases illustrated in (a) of FIG. 10 and that becomes constant or substantially becomes constant in the frequency range y larger than the frequency range in which the gain of the signal increases. In the case of FIG. 10, the frequency range in which the gain of the signal due to the skin effect increases coincides with the frequency range in which the gain of the filter unit 140 attenuates, and the minus of the upper limit of the gain of the signal coincides with the lower limit of the gain of the filter unit 140. Thus, the gain of the filter unit 140 is linearly symmetrical to the gain due to the skin effect illustrated in (a) of FIG. 10. Thereby, in all the frequency ranges, the gain of the signal due to the skin effect is canceled out by the gain of the filter unit 140, so that the gain of the amplification unit 150 illustrated in (c) of FIG. 10 coincides with the gain illustrated in (d) of FIG. 10.

The detection device 100 including the filter unit 140 with such a gain can obtain an ideal signal corresponding to the gain of the amplification unit 150 in all the frequency ranges, and can maintain the response time characteristics while suppressing an overshoot. Note that the gain of the signal due to the skin effect illustrated in FIG. 5, FIG. 7, FIG. 8, and (a) of FIG. 10 may represent the difference (for example, the unit is dB) from the gain of the signal with a flow of the direct detection current.

Figure 11:
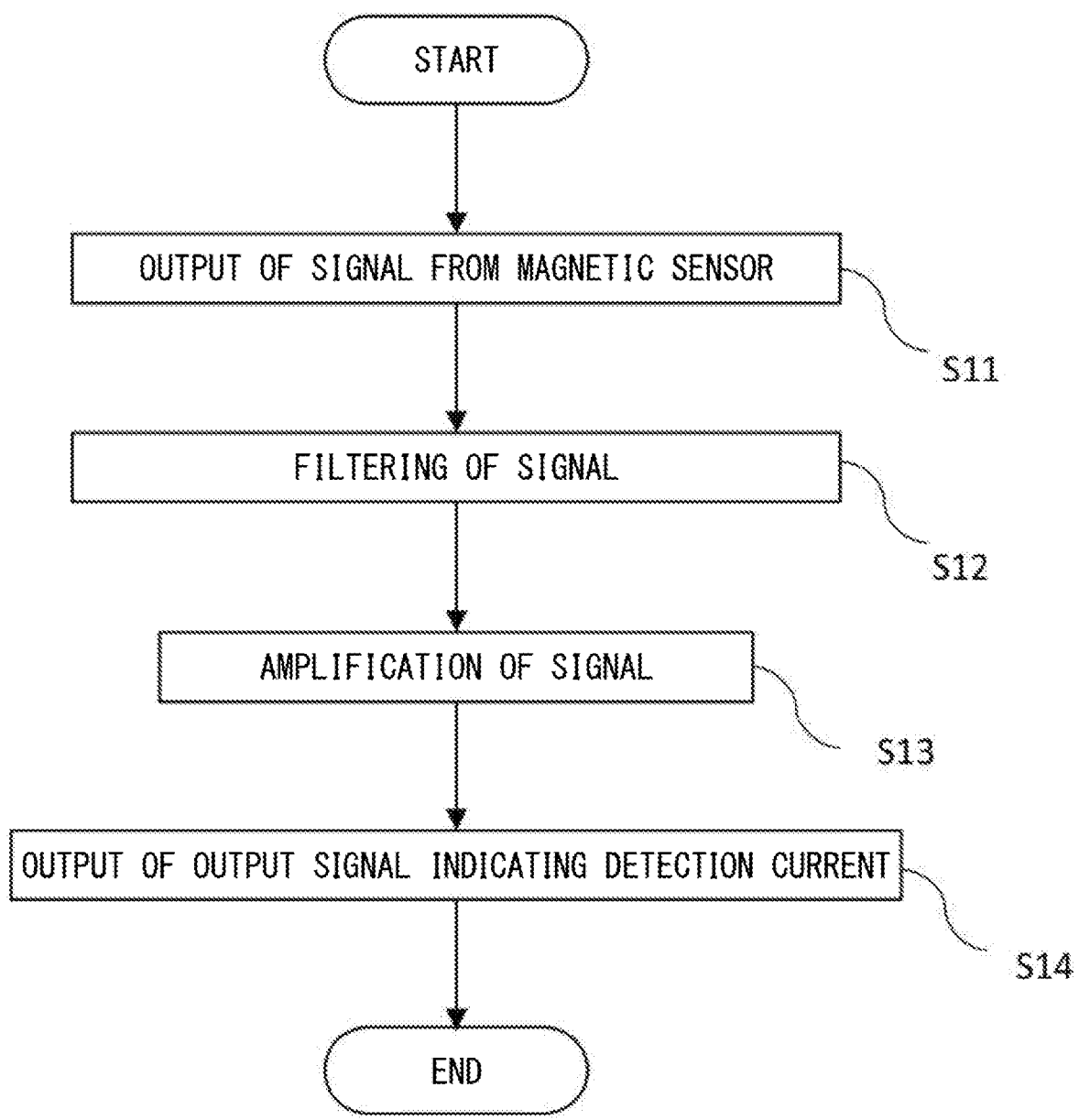
FIG. 11 illustrates a flow of detecting a detection current in the detection device of the first configuration example.

FIG. 11 illustrates a flow of detecting a detection current in the detection device 100 of the first configuration example. The detection device 100 starts detection of the detection current when the detection device 100 is powered on or when the detection current flows in the current path 110.

In S11, the magnetic sensor 120 outputs a signal corresponding to the magnetic field generated by the detection current flowing in the current path 110. The signal output from the magnetic sensor 120 may have a larger current amount as the detected magnetic field is larger, and may have a smaller current amount as the detected magnetic field is smaller.

In S12, the filter unit 140 filters the signal received by the reception unit 130 from the magnetic sensor 120 so as to decrease in a predetermined frequency range. The filter unit 140 may at least partially offset an increasing portion of the gain that is generated due to the skin effect with respect to the detection current of the signal output from the magnetic sensor 120. The filter unit 140 may have a gain that attenuates in at least a portion of the frequency range corresponding to the increasing portion. Furthermore, the filter unit 140 may have a constant gain or an increasing gain in a frequency range higher than the frequency range corresponding to the increasing portion.

In the frequency characteristic of the gain of the signal due to the skin effect illustrated in (a) of FIG. 8, the filter unit 140 may have a gain that attenuates from zero to minus in a frequency range as at least part of the frequency range x in which the gain of the signal increases until becoming larger than 0 and then constant. The filter unit 140 may have, for example, a gain that attenuates along with frequency increase in the frequency range of the signal of 10 kHz to 10 MHz and does not attenuate in the frequency range of higher than 10 MHz. The lower limit value of the gain of the filter unit 140 may be equal to or smaller than a minus value of the upper limit value of the gain generated due to the skin effect.

Here, the frequency characteristics of the gain of the signal due to the skin effect may differ depending on at least one of the shape and material of the current path 110, the layout of the current path 110 and the magnetic sensor 120, and the like. Therefore, when the detection device 100 is calibrated or when the detection device 100 is powered on, for example, the frequency characteristics of the gain of the signal as illustrated in (a) of FIG. 8 may be calculated in advance. Thus, the filter unit 140 may have a gain determined according to the frequency characteristics of the gain calculated in advance.

In S13, the amplification unit 150 amplifies the filtered signal with a predetermined gain. The amplification unit 150 may amplify a signal in a predetermined frequency range with a gain greater than zero.

In S14, the output unit 160 outputs an output signal indicating the detection current. The output unit 160 may output the signal as it is. In addition, the output unit 160 may output an output signal indicating a current value of the signal or an output signal indicating a result (for example, 0 or 1, low or high) of comparing the signal with a threshold. The detection device 100 may terminate the detection operation when the detection current no longer flows in the current path 110, when the amount of current of the signal output from the magnetic sensor 120 becomes 0, or when the detection device 100 is powered off.

The detection device 100 according to the present embodiment can adjust the gain of the entire detection device 100 by the filter unit 140 to suppress an overshoot and maintain favorable transient response characteristics of the magnetic field.

Figure 12:
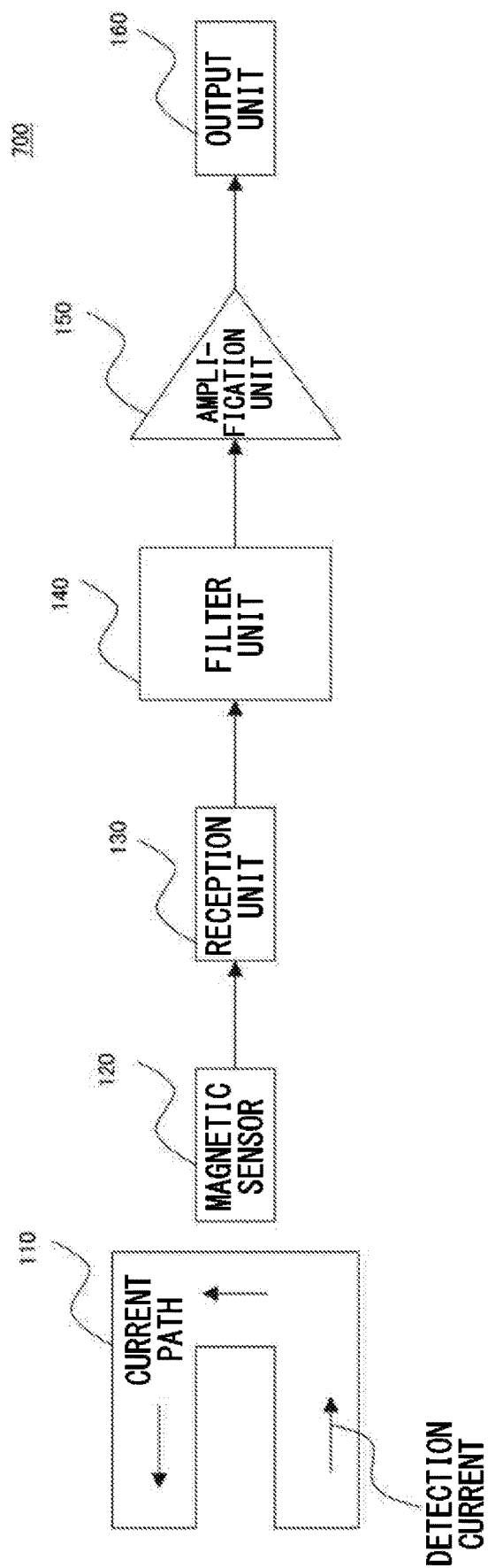
FIG. 12 illustrates a second configuration example of a detection device according to the present embodiment.

FIG. 12 illustrates a second configuration example of a detection device 700 according to the present embodiment. The detection device 700 illustrated in FIG. 12 is configured in the same manner as the detection device 100 of the first configuration example illustrated in FIG. 1 except that the positional relationship between the current path 110 of the current detection unit and the magnetic sensor 120 is different. That is, referring to FIG. 12, the current path 110 has a bending portion, and the magnetic sensor 120 is disposed outside the bending portion. In such a positional relationship, when the frequency of the detection current becomes high, the magnetic flux density detected by the magnetic sensor 120 due to the skin effect is more attenuated than the magnetic flux density with a direct current flowing in the current path 110. It is apparent that the gain attenuates when the magnetic sensor 120 is disposed outside the region surrounded by the current path 110 because the gain is increased due to the skin effect when the magnetic sensor 120 is disposed inside the bending portion of the current path 110 as illustrated in FIG. 2. With the magnetic flux density attenuated due to the skin effect, an attenuated signal indicating a smaller amount of current than the actual detection current is output from the magnetic sensor 120. As the frequency of the detection current becomes higher, the skin effect becomes more remarkable and the magnetic flux density detected by the magnetic sensor 120 becomes smaller. When the frequency of the detection current further increases, the change in the distribution of the current density in the current path 110 becomes sufficiently small, the gain of the magnetic flux density detected by the magnetic sensor 120 becomes saturated, and the gain of the signal also becomes saturated and constant.

As described above, the detection gain, which is the gain of the magnetic flux density detected by the magnetic sensor 120, has a gain fluctuation band that changes along with an increase in the frequency of the detection current, so that the filter unit 140 has a gain that cancels out the change in the detection gain in at least part of the gain fluctuation band. In the detection device 100 of the first configuration example, the detection gain increases along with an increase in the frequency of the detection current in the gain fluctuation band, so that the filter unit 140 has a gain that attenuates along with an increase in the frequency in at least part of the gain fluctuation band and does not attenuate along with a further increase in the frequency. On the other hand, in the detection device 100 of the second configuration example, the detection gain attenuates along with an increase in the frequency of the detection current in the gain fluctuation band, so that the filter unit 140 has a gain that is amplified along with an increase in the frequency in at least part of the gain fluctuation band and is not amplified along with a further increase in the frequency.

The filter unit 140 of the first configuration example and the filter unit 140 of the second configuration example may be configured in the same manner except for the gain. The filter unit 140 includes, for example, at least one of a band elimination filter, an active filter, a passive filter, an analog filter, and a digital filter having the gain described above.

In the present application, the gain of the signal with respect to the detection current may be the amplification factor of the signal output from the magnetic sensor 120 attenuated due to the skin effect with respect to the signal corresponding to the amount of current when the direct detection current flows. In addition, the detection unit of the present application may contain the magnetic sensor 120 in each of the embodiments.

Figure 13:
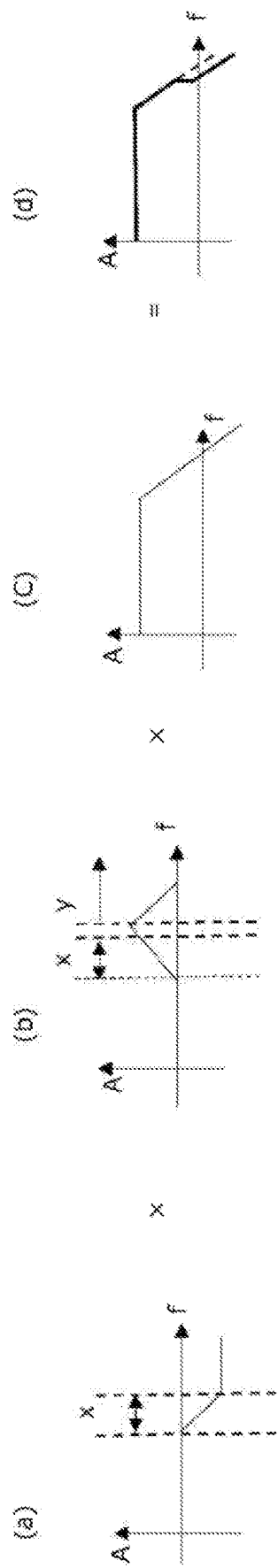
FIG. 13 illustrates diagrams describing the gain of a signal in the detection device of the second configuration example.

FIG. 13 illustrates diagrams describing the gain of a signal in the detection device 700 of the second configuration example illustrated in FIG. 12. (a) of FIG. 13 illustrates frequency characteristics of gain of a signal due to the skin effect. (b) of FIG. 13 illustrates frequency characteristics of the gain of the filter unit 140. (c) of FIG. 13 illustrates the frequency characteristics of gain of amplification of a signal by the amplification unit 150. (d) of FIG. 13 illustrates the total of the gain due to the skin effect, the gain of the filter unit 140, and the gain of the amplification unit 150 by a solid line, and also illustrates ideal characteristics of the total gain by a dotted line. As illustrated in (b) of FIG. 13, the filter unit 140 of the detection device 700 according to the second configuration example has a gain that increases from zero to plus along with frequency increase in at least part of a frequency range x (gain fluctuation band) in which the gain due to the skin effect attenuates from zero and that attenuates to 0 in a frequency range y larger than the frequency range x in which the gain of the signal attenuates due to the skin effect. In FIG. 13, a vertical axis A indicates the gain of the signal, and a horizontal axis f indicates the frequency of the signal.

When the steeply rising detection current flows in the current path 110, for example, the detection device 700 according to the second configuration example can offset the attenuation in the gain of the signal due to the skin effect by the increased gain in the filter unit 140, thereby to suppress an overshoot. Further, in the detection device 700 according to the second configuration example, the gain in the filter unit 140 does not increase in the higher frequency range than the frequency range where the gain due to the skin effect is saturated. Accordingly, the total gain is not excessively increased so that the response characteristics to the magnetic sensor 120 can be maintained.

Figure 14:
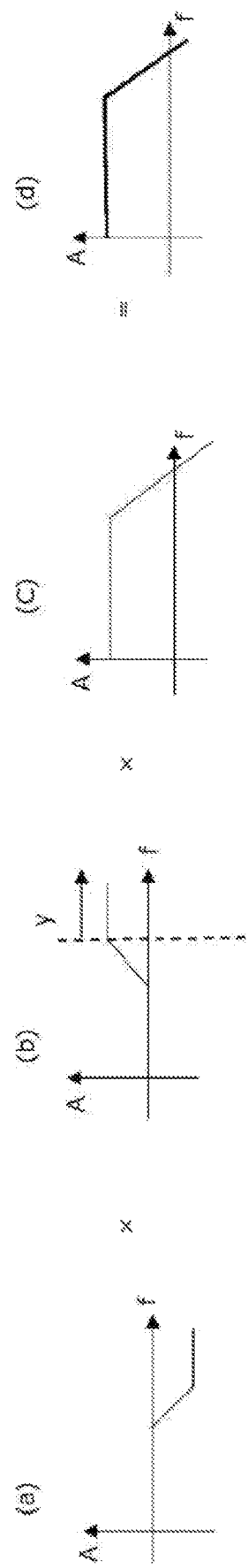
FIG. 14 illustrates diagrams describing the gain of a signal in the detection device of the second configuration example.

FIG. 14 illustrates diagrams describing the gain of a signal in the detection device 700 of the second configuration example illustrated in FIG. 12. Similarly to FIG. 13, FIG. 14 illustrates the gain in the detection device 700 of the second configuration example illustrated in FIG. 12, but the gain of the filter unit 140 is different. (a) of FIG. 14 illustrates frequency characteristics of gain of a signal due to the skin effect. (b) of FIG. 14 illustrates frequency characteristics of the gain of the filter unit 140. (c) of FIG. 14 illustrates the frequency characteristics of gain of amplification of a signal by the amplification unit 150. (d) of FIG. 14 illustrates the total of the gain due to the skin effect, and the gain of the filter unit 140, and the gain of the amplification unit 150 by a solid line. In FIG. 14, a vertical axis A indicates the gain of the signal, and a horizontal axis f indicates the frequency of the signal.

As illustrated in (b) of FIG. 14, the filter unit 140 has a gain that increases from zero to plus along with frequency increase in a frequency range (gain fluctuation band) in which the gain of the signal due to the skin effect attenuates illustrated in (a) of FIG. 14 and that becomes constant or substantially becomes constant in the frequency range y larger than the frequency range in which the gain of the signal attenuates. In the case of FIG. 14, the frequency range in which the gain of the signal due to the skin effect attenuates coincides with the frequency range in which the gain of the filter unit 140 increases, and the absolute value of the lower limit of the gain of the signal coincides with the lower limit of the gain of the filter unit 140. Thus, the gain of the filter unit 140 is linearly symmetrical to the gain due to the skin effect illustrated in (a) of FIG. 14. Thereby, in all the frequency ranges, the gain of the signal due to the skin effect is canceled out by the gain of the filter unit 140, so that the gain of the amplification unit 150 illustrated in (c) of FIG. 14 coincides with the gain illustrated in (d) of FIG. 14.

The detection device 700 including the filter unit 140 with such a gain can obtain an ideal signal corresponding to the gain of the amplification unit 150 in all the frequency ranges, and can maintain overshoot characteristics while suppressing response delay. Note that the gain of the signal due to the skin effect illustrated in FIG. 13 and (a) of FIG. 14 may represent the difference (for example, the unit is dB) from the gain of the signal with a flow of the direct detection current.

Figure 15:
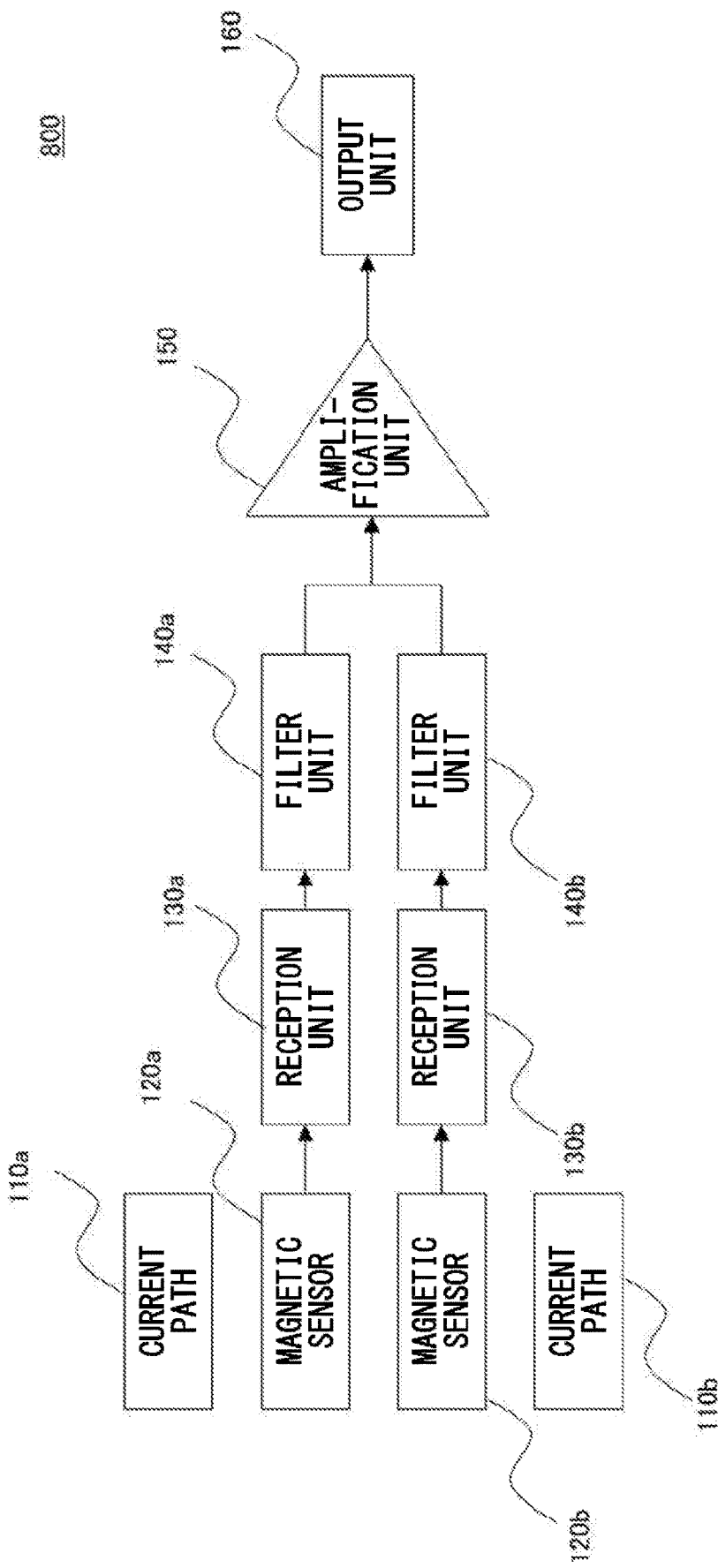
FIG. 15 illustrates a third configuration example of a detection device according to the present embodiment.

FIG. 15 illustrates a third configuration example of a detection device 800 according to the present embodiment. The detection device 800 illustrated in FIG. 15 is configured in the same manner as the detection device 100 of the first configuration example illustrated in FIG. 1 except for including pluralities of current paths 110a and 110b, magnetic sensors 120a and 120b, reception units 130a and 130b, and filter units 140a and 140b.

The plurality of current paths 110a and 110b may be similar to the current path 110 of the detection device 100 according to the first configuration example. The plurality of current paths 110a and 110b may not be electrically connected to each other but may individually flow the detection current. In addition, the plurality of current paths 110a and 110b may be electrically connected to each other and flow the same detection current.

The plurality of magnetic sensors 120a and 120b may be similar to the magnetic sensor 120 of the detection device 100 according to the first configuration example. The plurality of magnetic sensors 120a and 120b is respectively disposed in the vicinity of the current paths 110a and 110b to be detected. The plurality of magnetic sensors 120a and 120b may respectively output signals corresponding to the magnetic fields around the current paths 110a and 110b to be detected.

The reception units 130a and 130b may be similar to the reception unit 130 of the detection device 100 according to the first configuration example.

The plurality of filter units 140a and 140b may be similar to the filter unit 140 of the detection device 100 according to the first configuration example. Alternatively, either one or both may be similar to the filter unit 140 of the second configuration example. The detection device 800 of the third configuration example may individually process signals output from the plurality of filter units 140a and 140b, or may collectively process signals output from the plurality of filter units 140a and 140b.

The detection device 800 of the third configuration example has a plurality of sets of current paths and magnetic sensors. Even when the positional relationship between the current path and the magnetic sensor is different, the plurality of filter units having different gains can process a signal for each configuration and transmit an input signal with favorable response characteristics to the amplification unit.

Figure 16:
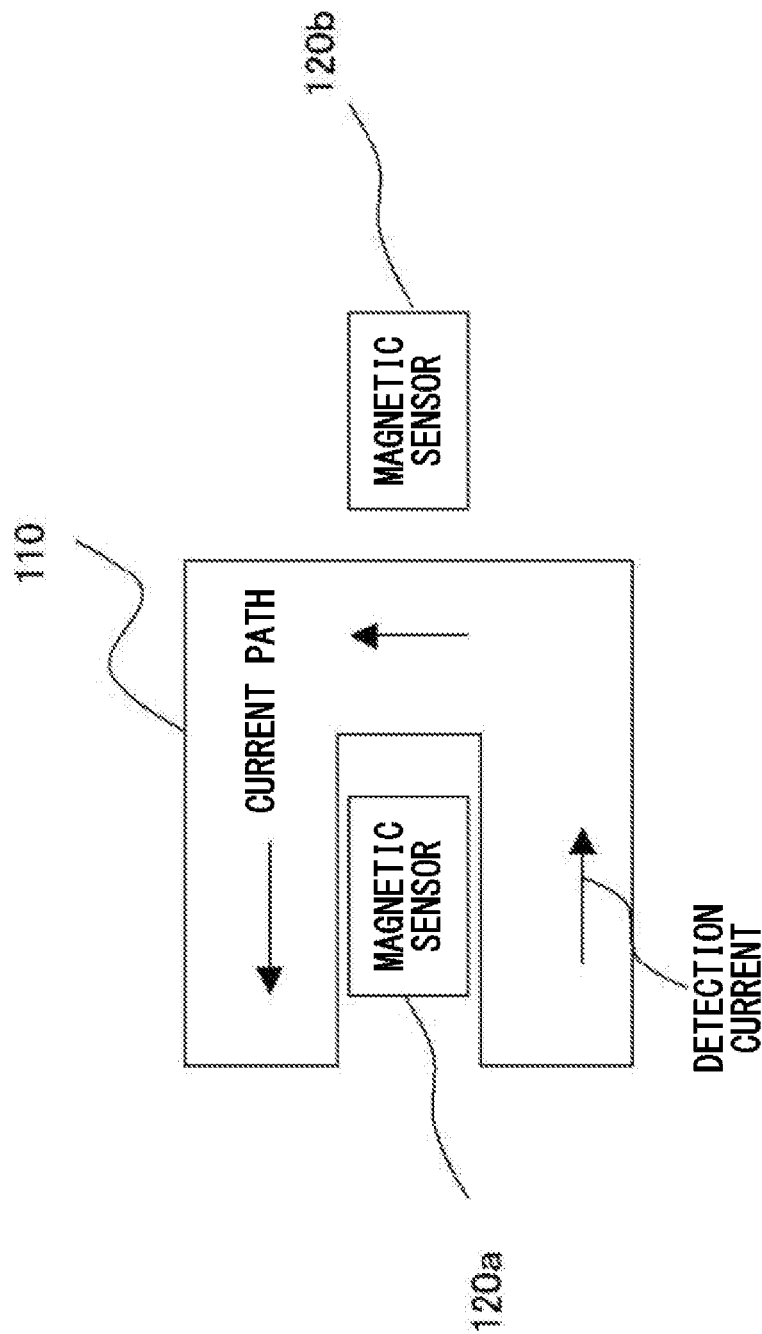
FIG. 16 illustrates a portion of the third configuration example of the detection device according to the present embodiment.

FIG. 16 is a diagram illustrating an example of the arrangement of the current path 110 and the magnetic sensor 120 in the detection device 800 of the third configuration example according to the present embodiment. In the detection device 800 of the third configuration example, in the case of installing the two magnetic sensors 120a and 120b in one current path 110, the plurality of magnetic sensors 120a and 120b may face each other with the current path 110 therebetween in plan view as illustrated in FIG. 16. In addition, depending on the orientation of magnetic sensing axes of the magnetic sensors 120a and 120b, the plurality of magnetic sensors 120a and 120b may face each other with the current path 110 interposed between the magnetic sensors 120a and 120b in cross-sectional view (for example, above and below the current path 110 as seen in a direction perpendicular to the plane where the current path 110 is disposed). In this case, the filter unit 140a to process the signal from the magnetic sensor 120a may have the same gain as the filter unit 140 of the detection device 100 of the first configuration example, and the filter unit 140b to process the signal from the magnetic sensor 120b may have the same gain as the filter unit 140 of the detection device 100 of the second configuration example. As above, in the detection device 800 of the present embodiment, it is preferable that the plurality of filter units 140 each have a gain corresponding to the positional relationship between the corresponding magnetic sensor 120 and current path 110.

Figure 17:
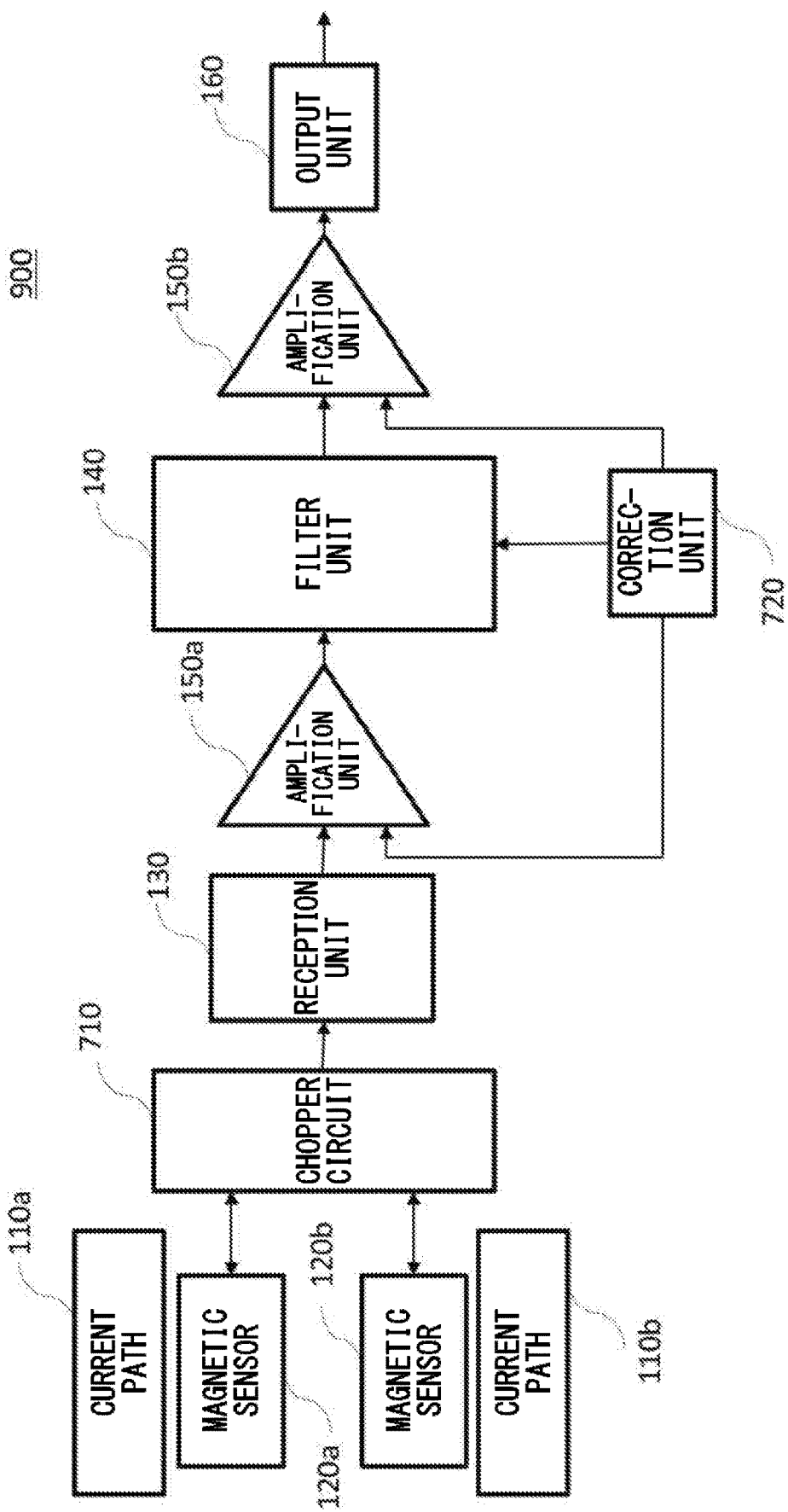
FIG. 17 illustrates a fourth configuration example of a detection device according to the present embodiment.

FIG. 17 illustrates a fourth configuration example of a detection device 900 according to the present embodiment. The detection device 900 illustrated in FIG. 17 is configured in the same manner as the detection device 100 of the first configuration example illustrated in FIG. 1 except for including pluralities of current paths 110a and 110b, magnetic sensors 120a and 120b, amplification units 150a and 150b, a chopper circuit 710, and a correction unit 720.

The plurality of current paths 110a and 110b may be similar to the current path 110 of the detection device 100 according to the first configuration example. The plurality of current paths 110a and 110b may not be electrically connected to each other but may individually flow the detection current. In addition, the plurality of current paths 110a and 110b may be electrically connected to each other and flow the same detection current.

The plurality of magnetic sensors 120a and 120b may be similar to the magnetic sensor 120 of the detection device 100 according to the first configuration example. The plurality of magnetic sensors 120a and 120b is respectively disposed in the vicinity of the current paths 110a and 110b to be detected. The plurality of magnetic sensors 120a and 120b may respectively output signals corresponding to the magnetic fields around the current paths 110a and 110b to be detected. The detection device 900 of the fourth configuration example may individually process signals output from the plurality of magnetic sensors 120a and 120b, or may collectively process signals output from the plurality of magnetic sensors 120a and 120b.

The amplification units 150a and 150b may be similar to the amplification unit 150 of the detection device 100 according to the first configuration example. The amplification unit 150a is connected between the reception unit 130 and the filter unit 140 to amplify a signal from the reception unit 130 and output the amplified signal to the filter unit 140. The amplification unit 150b is connected between the filter unit 140 and the output unit 160 to amplify the filtered signal and output the amplified signal to the output unit 160.

The chopper circuit 710 is connected between the magnetic sensors 120a, 120b and the reception unit 130 to chop signals output from the magnetic sensors 120a and 120b. The chopper circuit 710 may subject the magnetic sensors 120a and 120b to chopper drive and receive signals output from the sensors. For example, the chopper circuit 710 may switch the direction of the drive current of a Hall element included in each of the magnetic sensors 120a and 120b between the 0 degree direction and the 90 degree direction at the chopper frequency. The chopper circuit 710 may calculate the difference between the signals in the 0 degree direction and the 90 degree direction output from the magnetic sensors 120a and 120b, perform offset voltage removal and the like, and output the processed signals to the reception unit 130.

The correction unit 720 is connected to the amplification units 150a, 150b and the filter unit 140 to correct signals. The correction unit 720 may correct the setting the settings of the amplification units 150a, 150b and the filter unit 140 before the correction of signals. The correction unit 720 may correct the gains of the amplification units 150a, 150b and the filter unit 140, for example, to adjust the signals to desired current values.

The detection device 900 of the fourth configuration example can effectively reduce the offset or noise of the magnetic sensor 120 by the chopper circuit 710, and obtain signals amplified at a desired amplification factor by the correction unit 720. This makes it possible to suppress an overshoot and maintain favorable transient response characteristics of the magnetic field.

Note that one or more of amplification units 150 may be arranged at any one of the preceding stage and the following stage of the filter unit 140, or a plurality of amplification units 150 may be arranged at both the preceding stage and the following stage. Furthermore, the unit of "gain" in the present application may be dB as an example.

Figure 18:
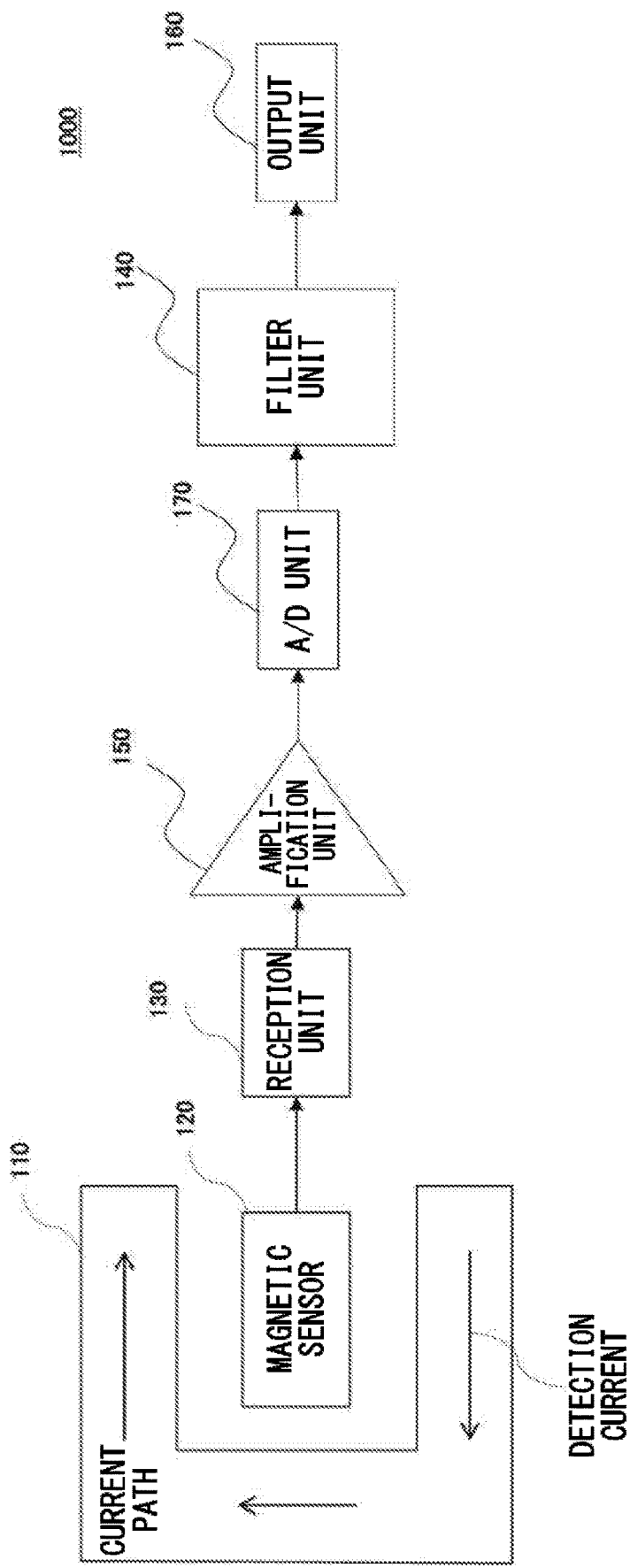
FIG. 18 illustrates a fifth configuration example of a detection device according to the present embodiment.

FIG. 18 illustrates a fifth configuration example of a detection device 1000 according to the present embodiment. The detection device 1000 illustrated in FIG. 18 is configured in the same manner as the detection device 100 of the first configuration example illustrated in FIG. 1 except for including an A/D unit 170 that converts an analog signal into a digital signal. The filter unit 140 may be positioned at the preceding stage or the following stage of the A/D unit 170.

The detection device 1000 according to the fifth configuration example can suppress an overshoot in the entire frequency range by the filter unit 140, maintain the response time characteristics, and output digital signals having undergone analog/digital conversion by the A/D unit 170 from the output unit 160.

When the filter unit 140 is disposed at the preceding stage of the A/D unit 170, the filter unit 140 can reduce an overshoot due to the skin effect and transmit ideal signals corresponding to the gain of the amplification unit 150 to the A/D unit 170. This decreases the input range of the A/D unit 170.

When the filter unit 140 is disposed at the following stage of the A/D unit 170 as illustrated in FIG. 18, the filter unit 140 may be a digital filter. With the digital filter, it is not necessary to take into consideration that the characteristics of the filter unit vary due to temperature or element variations. Note that the detection devices in all the embodiments may be current sensors.

Various embodiments of the present invention may be described with reference to flowcharts and block diagrams, where the blocks can represent (1) process steps of operations to be performed (2) sections of the devices in responsible for performing the operations. Specific steps and sections may be implemented by dedicated circuits, programmable circuits supplied with computer-readable instructions stored on computer-readable media, and/or processors supplied with computer-readable instructions stored on computer-readable media. Dedicated circuits may include digital and/or analog hardware circuits, and may include integrated circuits (ICs) and/or discrete circuits. Programmable circuits may include reconfigurable hardware circuits including memory elements such as logic AND, logical OR, logical XOR, logic NAND, logical NOR, and other logical operations, flip flops, registers, field programmable gate arrays (FPGAs), programmable logic arrays (PLAs), and others.

A computer-readable medium may include any tangible device capable of storing instructions to be executed by an appropriate device, so that the computer-readable medium having instructions stored therein contains a product including instructions that can be executed to create means for executing operations specified in the flowcharts or block diagrams. Examples of the computer readable media may include electronic storage media, magnetic storage media, optical storage media, electromagnetic storage media, semiconductor storage media, and others. More specific examples of the computer readable media may include floppy (registered trademark) disk, diskette, hard disk, random access memory (RAM), read only memory (ROM), erasable programmable read only memory (EPROM or flash memory), electrically erasable programmable read only memory (EEPROM), static random access memory (SRAM), compact disc read only memory (CD-ROM), digital versatile disc (DVD), Blu-Ray (registered trademark) disc, memory stick, integrated circuit card, and others.

The computer readable instructions may include source code or object code described in one programming language or an arbitrary combination of programming languages including assembler instructions, instruction set architecture (ISA) instructions, machine instructions, machine dependent instructions, microcode, firmware instructions, state setting data, or object oriented programming languages such as Smalltalk, JAVA (registered trademark), and C++, Python, and conventional procedural programming languages such as "C" programming languages and similar programming languages.

The computer-readable instructions may be provided to general-purpose computers, special-purpose computers, or other processors or programmable circuits in programmable data processing devices, locally or via a local area network (LAN) or a wide area network (WAN) such as the internet. The computer-readable instructions may be executed to create means for executing the operations specified in the flowcharts or block diagrams. Examples of processors include computer processors, processing units, microprocessors, digital signal processors, controllers, microcontrollers, and others.

Figure 19:
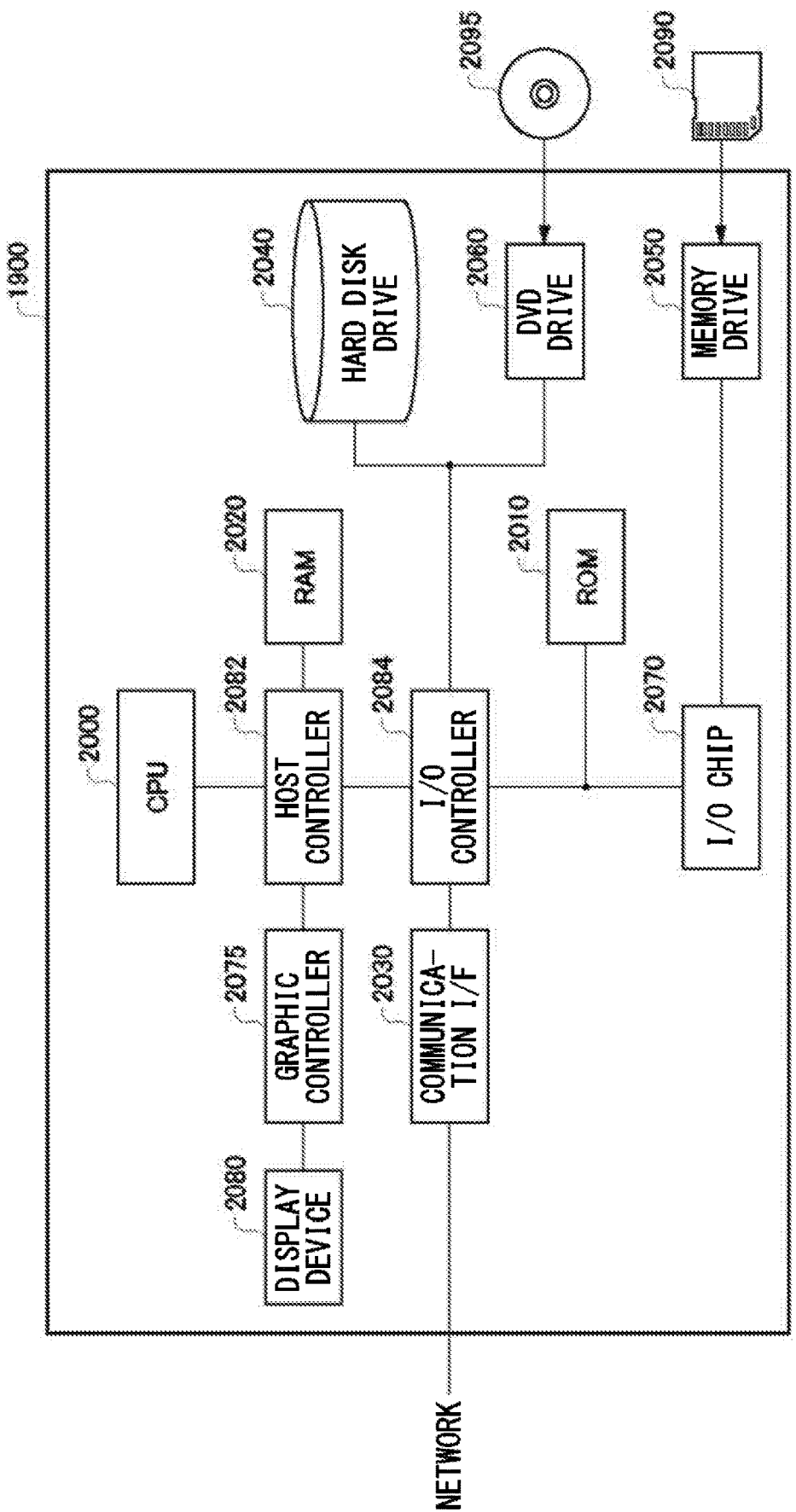
FIG. 19 illustrates an example of a computer in which a plurality of aspects of the present embodiment can be fully or partially embodied.

FIG. 19 illustrates an example of a computer 1900 in which a plurality of aspects of the present invention may be fully or partially embodied. The program installed in the computer 1900 can cause the computer 1900 to function as operations associated with the device according to the embodiments of the present invention or one or more sections of the device, or can cause the computer 1900 to execute the operations or the one or more sections, and/or can cause the computer 1900 to execute processes according to the embodiments or steps of the processes. The program may be executed by a CPU 2000 to cause the computer 1900 to perform specific operations associated with some or all of the flowcharts or the blocks in the block diagrams described herein.

The computer 1900 according to the present embodiment includes a CPU peripheral unit having the CPU 2000, a RAM 2020, a graphic controller 2075, and a display device 2080 connected to one another by a host controller 2082, a communication interface 2030 connected to the host controller 2082 by an input/output controller 2084, a hard disk drive 2040, an input/output unit having a DVD drive 2060, a ROM 2010 connected to the input/output controller 2084, a flash memory drive 2050, and a legacy input/output unit having an input/output chip 2070.

The host controller 2082 connects the RAM 2020 to the CPU 2000 and the graphic controller 2075 which access the RAM 2020 at a high transfer rate. The CPU 2000 operates based on programs stored in the ROM 2010 and the RAM 2020 to control each component. The graphic controller 2075 acquires image data generated by the CPU 2000 or the like on a frame buffer provided in the RAM 2020 and causes the display device 2080 to display the image data. Instead of this, the graphic controller 2075 may internally include a frame buffer for storing image data generated by the CPU 2000 or the like.

The input/output controller 2084 connects the host controller 2082 to the communication interface 2030, the hard disk drive 2040, and the DVD drive 2060, which are relatively high-speed input/output devices. The communication interface 2030 communicates with other devices via a network by wire or wirelessly. The communication interface also functions as hardware that performs communication. The hard disk drive 2040 stores programs and data used by the CPU 2000 in the computer 1900. The DVD drive 2060 reads a program or data from the DVD 2095 and provides the same to the hard disk drive 2040 via the RAM 2020.

Further, the ROM 2010, the flash memory drive 2050, and the relatively low-speed input/output devices of the input/output chip 2070 are connected to the input/output controller 2084. The ROM 2010 stores a boot program to be executed by the computer 1900 at the time of start-up, and/or programs depending on the hardware of the computer 1900, and others. The flash memory drive 2050 reads a program or data from the flash memory 2090 and provides the same to the hard disk drive 2040 via the RAM 2020. The input/output chip 2070 connects the flash memory drive 2050 to the input/output controller 2084, and connects various inputs/output devices to the input/output controller 2084 via, for example, a parallel port, a serial port, a keyboard port, a mouse port, or the like.

The programs provided to the hard disk drive 2040 via the RAM 2020 are stored in a recording medium such as a flash memory 2090, a DVD 2095, or an IC card and provided by the user. The program is read from the recording medium, installed in the hard disk drive 2040 in the computer 1900 via the RAM 2020, and executed by the CPU 2000. The information processing described in these programs is read into the computer 1900 to effect cooperation between the software and the various types of hardware resources described above. An apparatus or method may be configured by implementing the operation or processing of information in accordance with the use of the computer 1900.

As an example, when communication is performed between the computer 1900 and an external device or the like, the CPU 2000 executes the communication program loaded on the RAM 2020, and instructs the communication interface 2030 to perform communication processing based on the contents of the processing described in the communication program. Under the control of the CPU 2000, the communication interface 2030 reads transmission data stored in a transmission buffer area or the like provided on a storage device such as the RAM 2020, the hard disk drive 2040, the flash memory 2090, or the DVD 2095, and transmits the same to the network. Alternatively, the communication interface 2030 writes the reception data received from the network to a reception buffer area or the like provided on the storage device. As described above, the communication interface 2030 may transfer transmission/reception data to/from the storage device by the direct memory access (DMA) method. Alternatively, the CPU 2000 may read the data from the storage device or the communication interface 2030 as a transfer source and write the data to the communication interface 2030 or the storage device as a transfer destination, thereby to transfer the transmission/reception data.

In addition, the CPU 2000 causes all or necessary portions of files or databases stored in an external storage device such as the hard disk drive 2040, the DVD drive 2060 (DVD 2095), and the flash memory drive 2050 (flash memory 2090) to be read into the RAM 2020 by DMA transfer or the like, and performs various types of processing on the data on the RAM 2020. Then, the CPU 2000 writes the processed data back to the external storage device by DMA transfer or the like. In such processing, the RAM 2020 can be regarded as temporarily holding the contents of the external storage device. Thus, in the present embodiment, the RAM 2020 and the external storage devices are collectively referred to as a memory, a storage unit, or a storage device.

Various kinds of information such as various kinds of programs, data, tables, databases, and others in the present embodiment are stored on such a storage device and become a target of information processing. The CPU 2000 can hold a part of the RAM 2020 in a cache memory, and can read and write the part on the cache memory. Even in such a mode, the cache memory performs some of the functions of the RAM 2020. Thus, in the present embodiment, the cache memory is also included in the RAM 2020, the memory, and/or the storage device unless particularly discriminated.

In addition, the CPU 2000 performs various operations described above in relation to the present embodiment on data read from the RAM 2020 and specified by a program instruction sequence, including various kinds of computation, information processing, condition determination, information search/replacement, and others, and writes the processing results back to the RAM 2020. For example, in the case of performing the condition determination, the CPU 2000 determines whether the various variables described above in relation to the present embodiment satisfy each of the conditions such as greater than, less than, equal to or greater than, equal to or less than, or equal to other variables or constants. When the condition is satisfied (or not satisfied), the CPU 2000 branches to a different instruction sequence or calls a subroutine.

The CPU 2000 can also search a file in the storage device or information stored in the database. For example, in the case where there is stored in the storage device a plurality of entries in which the attribute value of a second attribute is associated with the attribute value of a first attribute, the CPU 2000 can search the plurality of entries stored in the storage device for an entry in which the attribute value of the first attribute matches a specified condition, and read the attribute value of the second attribute stored in the entry, thereby to obtain the attribute value of the second attribute associated with the first attribute satisfying the predetermined condition.

In addition, when a plurality of elements is listed in the description of the embodiment, elements other than the listed elements may be used. For example, when it is described that "X performs Y using A, B, and C", then X may perform Y using D in addition to A, B, and C.

As above, the present invention has described so far with reference to the embodiment. However, the technical scope of the present invention is not limited to the scope as described above in relation to the embodiment. It is apparent to those skilled in the art that various changes or modifications can be added to the embodiment described above. It is also apparent from the description of the claims that the modes to which such changes or modifications are added can be included in the technical scope of the present invention.

Note that the processes such as operations, procedures, steps, and stages in the apparatuses, systems, programs, and methods described in the claims, the specification, and the drawings can be executed in arbitrary orders unless the word such as "before", "prior to", or the like is explicitly used or the output of the preceding process is to be used in the following process. Even if the flows of operations in the claims, the specification, and the drawings are described using the words "first," "next," and others for the sake of convenience, this does not means that it is essential that the operations be performed in this order.

What is claimed is:

1. A current sensor comprising:
   a detection unit that outputs a signal corresponding to a magnetic field generated by detection current flowing through a current path;

a reception unit that receives the signal corresponding to the magnetic field;
a filter unit that filters the signal received by the reception unit; and
an output unit that outputs an output signal indicating the detection current according to the filtered signal, wherein
detection gain, as gain of magnetic flux density detected by the detection unit, has a gain fluctuation band that changes along with an increase in a frequency of the detection current, and
the filter unit has a gain that cancels out the change in the detection gain in at least a part of the gain fluctuation band.

2. The current sensor according to claim 1, wherein
the detection gain increases along with an increase in a frequency of the detection current in the gain fluctuation band, and
the filter unit has a gain that attenuates along with an increase in the frequency in at least part of the gain fluctuation band and does not attenuate along with a further increase in the frequency.

3. The current sensor according to claim 2, wherein
the filter unit has a constant gain or a gain that increases to 0 dB in a frequency range larger than a frequency range of the at least part of the gain fluctuation band.

4. The current sensor according to claim 2, wherein
the filter unit has a gain that attenuates along with an increase in a frequency in a frequency range of 10 kHz to 10 MHz.

5. The current sensor according to claim 1, wherein
the detection gain attenuates along with an increase in a frequency of the detection current in the gain fluctuation band, and
the filter unit has a gain that amplifies along with an increase in the frequency in at least part of the gain fluctuation band and does not amplify along with a further increase in the frequency.

6. The current sensor according to claim 5, wherein
the filter unit has a constant gain or a gain that attenuates to 0 dB in a frequency range larger than a frequency range of the at least part of the gain fluctuation band.

7. The current sensor according to claim 5, wherein
the filter unit has a gain that amplifies along with an increase in a frequency in a frequency range of 10 kHz to 10 MHz.

8. The current sensor according to claim 1, comprising
one or more amplification units that amplify the signal filtered by the filter unit.

9. The current sensor according to claim 1, comprising
a plurality of amplification units that amplify the signal, wherein
the filter unit is disposed between the plurality of amplification units.

10. The current sensor according to claim 1, wherein
the detection unit includes a magnetic sensor built in the same package as the current path and configured to output the signal to the reception unit.

11. The current sensor according to claim 10, wherein
the detection unit includes a plurality of the magnetic sensors.

12. The current sensor according to claim 11, comprising
a plurality of the filter units having different gains for the plurality of magnetic sensors.

13. The current sensor according to claim 11, wherein
the plurality of magnetic sensors face each other with the current path interposed between the magnetic sensors in plan view.

14. The current sensor according to claim 10, wherein
the magnetic sensor includes a Hall element, a magnetoresistive element (MR), a giant magnetoresistive element (GMR), a tunnel effect magnetoresistive element (TMR), a magnetic impedance element (MI element), or an inductance sensor.

15. The current sensor according to claim 1, comprising
a correction unit that corrects the signal.

16. The current sensor according to claim 1, comprising
a chopper circuit that chops the signal.

17. The current sensor according to claim 1, comprising
an AD conversion circuit that converts the signal into a digital signal and outputs the digital signal.

18. A non-transitory computer readable medium storing a program for causing a computer to function as the current sensor according to claim 1.

19. A detection method for detecting a detection current flowing in a current path, the detection method comprising:
receiving a signal corresponding to a magnetic field generated by the detection current;
filtering the received signal; and
outputting an output signal indicating the detection current according to the filtered signal, wherein
detection gain, as gain of magnetic flux density of the magnetic field, has a gain fluctuation band that changes along with an increase in a frequency of the detection current, and
the filtering has filtering the signal by a filter that has a gain that cancels out the change in the detection gain in at least a part of the gain fluctuation band.

20. A detection device that detects a detection current flowing in a current path, comprising:
a reception unit that receives a signal corresponding to a magnetic field generated by the detection current;
a filter unit that filters the signal received by the reception unit; and
an output unit that outputs an output signal indicating the detection current according to the filtered signal, wherein
the filter unit has a gain that attenuates along with an increase in a frequency in at least a part of a frequency range in which a gain of the signal with respect to the detection current increases, and does not attenuate along a further increase in the frequency.

* * * * *